(12) United States Patent
Shumarayev et al.

(10) Patent No.: US 11,115,025 B2
(45) Date of Patent: Sep. 7, 2021

(54) UNIVERSAL TRANSCEIVER CONTAINER

(71) Applicant: Intel Corporation, Santa Clara, CA (US)

(72) Inventors: Sergey Y. Shumarayev, Los Altos Hills, CA (US); David W. Mendel, Sunnyvale, CA (US); Joel Martinez, San Jose, CA (US); Curt Wortman, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 648 days.

(21) Appl. No.: 15/940,864

(22) Filed: Mar. 29, 2018

(65) Prior Publication Data
US 2019/0044517 A1 Feb. 7, 2019

(51) Int. Cl.
| H03K 19/17736 | (2020.01) |
| G06F 13/42 | (2006.01) |
| H04L 7/033 | (2006.01) |
| H01Q 21/00 | (2006.01) |
| H04L 12/40 | (2006.01) |

(52) U.S. Cl.
CPC ... *H03K 19/17744* (2013.01); *G06F 13/4282* (2013.01); *H04L 7/033* (2013.01); *H04L 12/40* (2013.01); *H01Q 21/0025* (2013.01)

(58) Field of Classification Search
None
See application file for complete search history.

(56) References Cited

U.S. PATENT DOCUMENTS

| 7,598,768 B1 * | 10/2009 | Tetzlaff | G05B 19/054 |
| | | | 326/38 |
| 8,571,059 B1 * | 10/2013 | Zaliznyak | G06F 13/385 |
| | | | 370/464 |
| 10,536,174 B1 * | 1/2020 | Choe | H04B 1/005 |

\* cited by examiner

*Primary Examiner* — Anh Q Tran
(74) *Attorney, Agent, or Firm* — Fletcher Yoder, P.C.

(57) ABSTRACT

The present disclosure relates to modular transceiver-based network circuitries that may include internal configurable interfaces or gaskets. The configurable gaskets may facilitate integration of the network circuitries in electronic devices by providing a transparent interface to processing circuitries coupled to the network circuitries. Moreover, the configurable gaskets may also have a floorplan layout (e.g., a chiplet layout) that may facilitate coupling of multiple network circuitries to a single processing circuitry, in a modular manner.

24 Claims, 8 Drawing Sheets

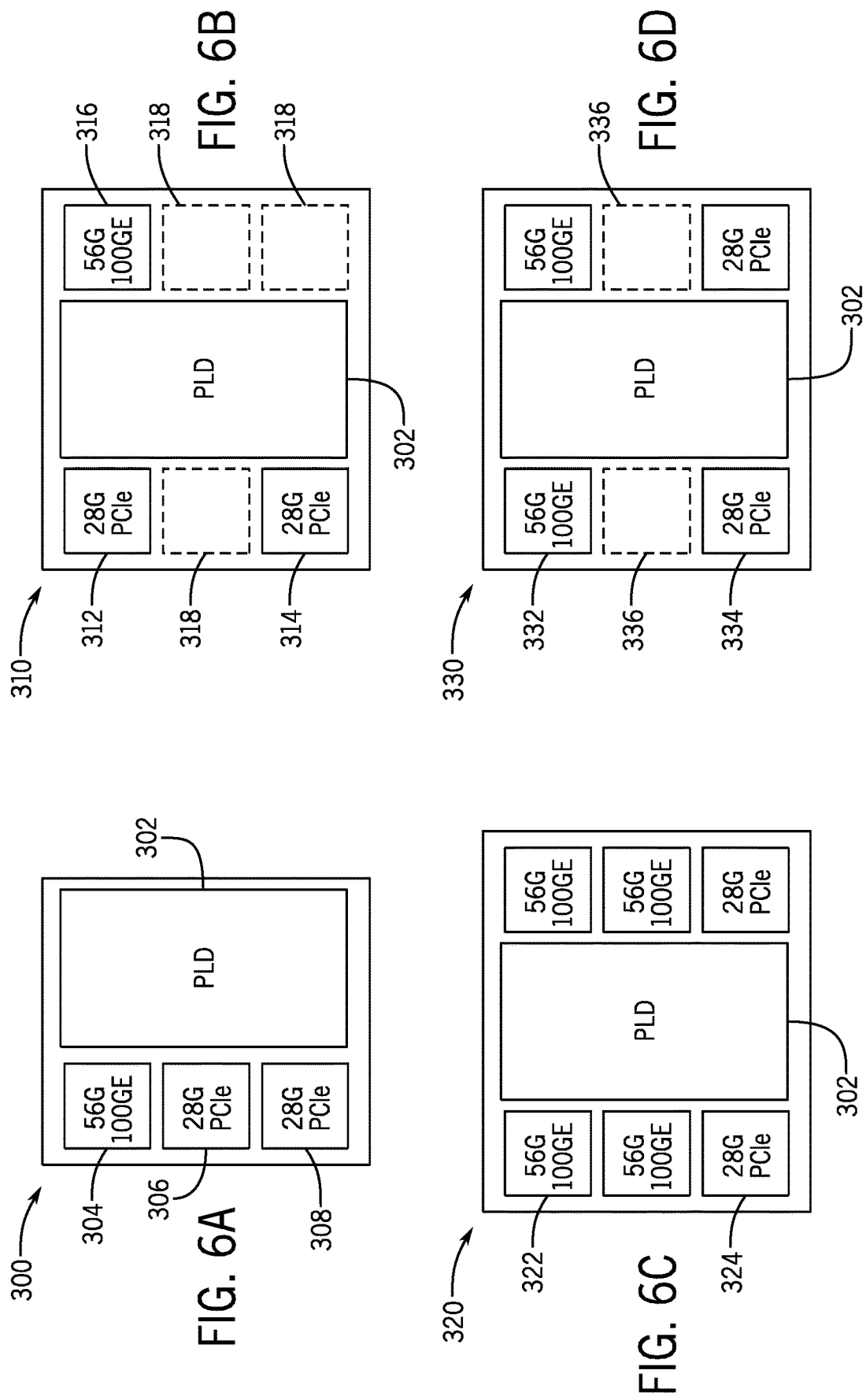

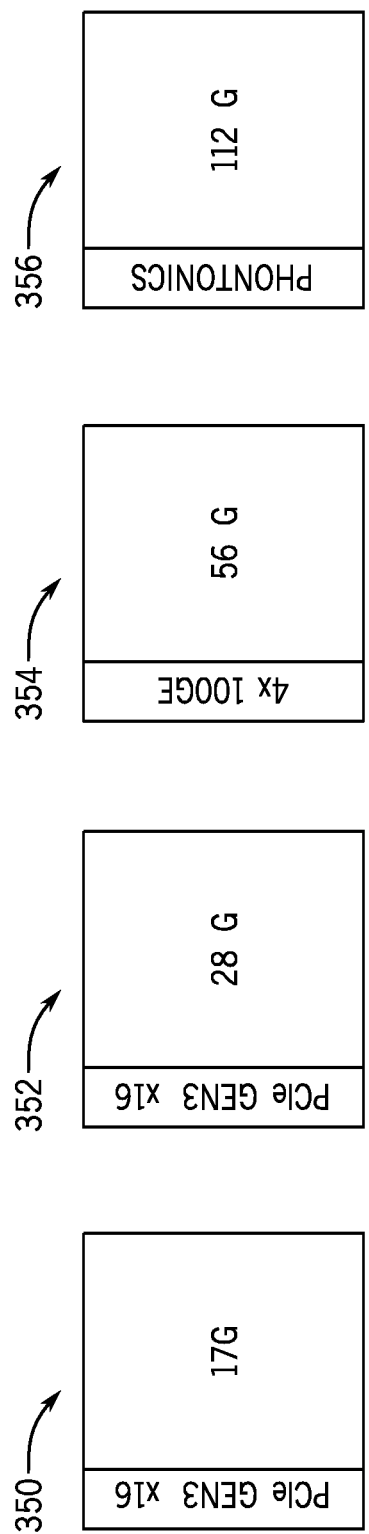
FIG. 7A
FIG. 7B
FIG. 7C
FIG. 7D
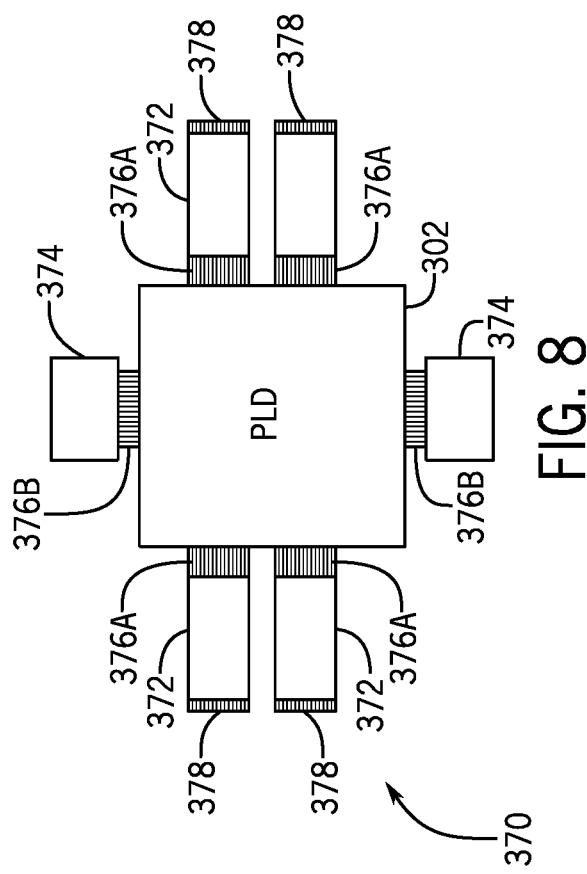
FIG. 8

UNIVERSAL TRANSCEIVER CONTAINER

BACKGROUND

This disclosure relates to transceiver design for high speed data links, and more specifically, to a flexible reconfigurable transceiver design that can be employed with multiple different protocols.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Many digital electronic devices, such as servers, data processing accelerators, and general-purpose computers, may operate by interacting with other devices using data links, which may be serial data links. As an example, a data center may include data processing servers and data storage servers that may be coupled by an Ethernet network or by a Peripheral Component Interconnect Express (PCIe) link. To that end, the electronic devices may include circuitry dedicated to providing physical access to the network medium, and to implementing the data link protocols.

As improvements in the technology lead to increase in data storage, network bandwidth, and/or processing power of electronic devices, demand for increase in the bandwidth of the data links may also increase. As a result, the network protocols, the specifications, and implementation methods may change. Such changes in the protocol may lead to complete redesign of the network circuitries and of the electronic components coupled to the network circuitries, which may lead to substantial upgrading costs and long times to market for the products.

BRIEF DESCRIPTION OF THE DRAWINGS

Various aspects of this disclosure may be better understood upon reading the following detailed description and upon reference to the drawings in which:

FIG. 6A is a diagram of circuitry of an electronic device that may be coupled to multiple network chiplets using modular architecture, in accordance with an embodiment;

FIG. 6B is another layout of circuitry in an electronic device that may be coupled to multiple network chiplets using the modular architecture, in accordance with an embodiment;

FIG. 6C is another layout of circuitry in an electronic device that may be coupled to multiple network chiplets using the modular architecture, in accordance with an embodiment;

FIG. 6D is another layout of circuitry in an electronic device that may be coupled to multiple network chiplets using the modular architecture, in accordance with an embodiment;

FIG. 7A is a diagram of a transceiver-based PCIe chiplet, in accordance with an embodiment;

FIG. 7B is a diagram of another transceiver-based PCIe chiplet, in accordance with an embodiment;

FIG. 7C is a diagram of a transceiver-based Ethernet chiplet, in accordance with an embodiment;

FIG. 7D is a diagram of another transceiver-based Ethernet chiplet, in accordance with an embodiment;

FIG. 8 is a layout of a modular architecture that may be used for designing an electrical network with a transceiver-based chiplet, in accordance with an embodiment;

DETAILED DESCRIPTION OF SPECIFIC EMBODIMENTS

Figure 1:
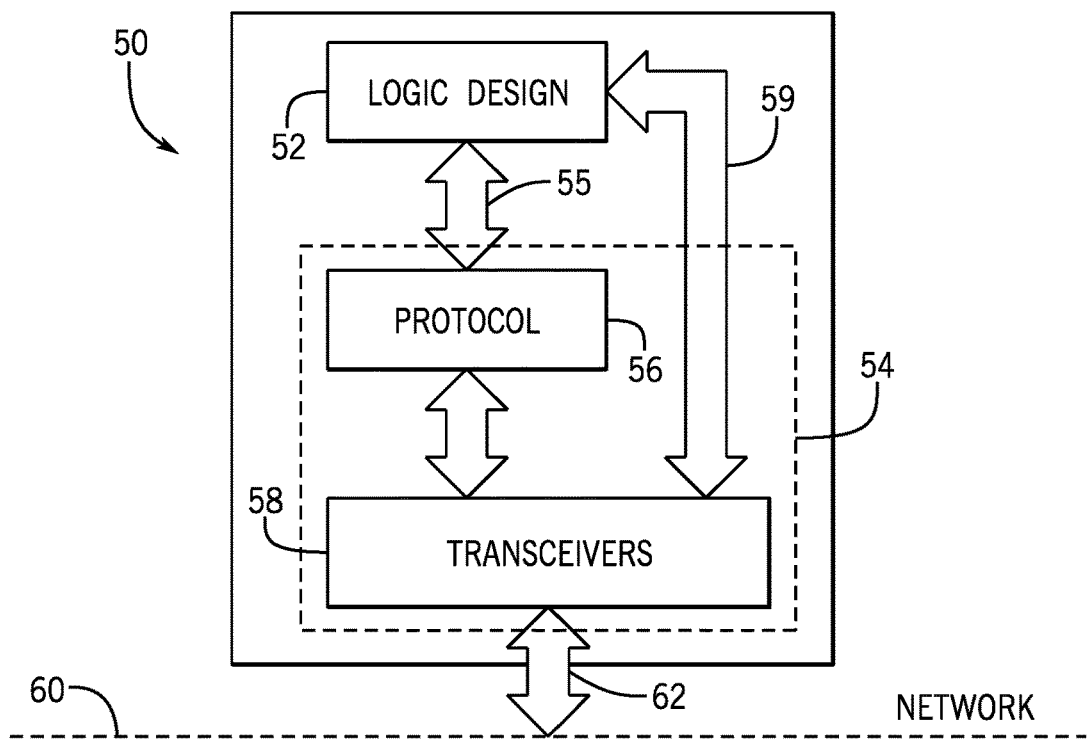
FIG. 1 is an example of an electronic device that may couple to a network using a network interface card that may include configurable transceiver-based network circuitry, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

Many electronic devices may employ dedicated circuitry to facilitate communication between electronic devices. For example, electronic devices may include adaptors to join networks. Example of such adaptors include Ethernet network interface cards (NICs) and data link adaptors, including Peripheral Component Interconnect Express (PCIe). Such adaptors may include a transceiver, physical layer (PHY) circuitry, which may include a physical medium attachment (PMA) sublayer and the physical coding sublayer (PCS), and data link layer circuitry, which may include a media access control (MAC) sublayer. These dedicated adaptors may be used to provide communication functionalities and may handle the protocol instructions and/or specifications associated with data encoding and control signals, handshakes, etc., and may thus provide a transparent network access for the processing circuitry in the electronic device.

These communication adaptors may exchange data and/or instructions with the processing circuitry of the electronic device via an internal interface. As a result, a flexible modular design may be obtained. While the communication adaptors perform network functionalities, the processing circuitry may perform computations associated with functionalities of the electronic device. By way of example, processing circuitry in a network package switch or router may perform functions associated with resource allocation, packet distribution, and address parsing, processing circuitry in a graphics card may perform calculations on data, and processing circuitry in a data center server may organize incoming data into a database, and verify integrity of data.

As the power of processing circuitry and/or as the bandwidth capability of physical medium increases, the protocols may be modified to accommodate the increases power. As a result, substantial redesign of the adaptors and of the processing circuitry may take place. Embodiments described herein are related to modular architectures for communication circuitry and processing. In certain embodiments, configurable "gaskets" may be used to provide flexibility. In such systems, the hardened circuitry that implements protocol logic may interface with programmable gaskets that may translate data and signals between modules of the network circuitries. Embodiments described herein may also include standardized floorplan dimensions, which may allow for easy deployment of circuitries in soft and/or hard logic, as detailed below.

With the foregoing in mind, FIG. 1 illustrates an electronic device 50, which may include processing circuitry 52 that may perform computations associated with functionalities provided by the electronic device 50. Processing circuitry 52 may include components that may be implemented as an application-specific integrated circuit (ASIC), a field-programmable gate array (FPGA), and/or one or more processors (e.g., CPUs) connected to a memory that may contain program instructions. The processing circuitry 52 may be coupled to a flexible network circuitry 54 via an internal interface 55, such as the ones detailed below. In some implementations, the internal interface 55 may be an interconnect.

The network circuitry 54 may include protocol circuitry 56, which may include (MAC) circuitry. The MAC circuitry may implement physical layer addressing functionalities, and/or error checking functionalities. The network circuitry 54 may also include transceiver circuitry 58, which may include the PCS, and PMA layer, which may provide modulation, and encoding functionalities. In certain electrical devices, the logic design may also control the transceiver circuitry 58 directly, via status and control interface 59. Transceiver circuitry 58 may also provide access to the physical network 60 via the connection 62. The transceiver circuitry 58 may also include clock networks, which may be implemented using phase-lock loops (PLLs), and may be used to clock the outgoing and the received signals. Transceiver circuitry 58 may also include clock-and-data recovery (CDR) circuitry to receive signals.

As discussed in more detail below, the logical components of the network circuitry 54, which may include the PMA, the PCS, and the MAC, may be implemented using an ASIC and/or an FPGA digital circuit. These digital components may be coupled to the analog components of the transceiver circuitry 58, such as the CDR and/or the PLLs. In certain implementations that employ an FPGA, the logical components may be implemented using programmable logic (e.g., soft intellectual property (soft IP)) or hardened logic (hard IP). As detailed below, the network circuitry 54 may be implement a chiplet interface standard, which provides transparent functionality and easy floorplan integration, allowing modular replacement of the network circuitry 54.

It should be noted that the above-described architecture for the network circuitry 54 allow flexible rearrangement of the modules. While the illustrated embodiment describe a system with PMA, PCS, and MAC circuitries and/or modules, the architecture may allow for other flexible network architectures. For example, the systems described herein may be used to implement with a system without a PMA (i.e., only with a PMA and a PCS). Alternatively, other layers of the network stack may be incorporated, such as forward error correction (FEC) layer, a MAC security (MACSec) layer, an IP parser for network filtering, a direct memory access (DMA) engine, or other members that may be used to implement IP stack implementations, PCIe implementations, and/or other communication and network interfaces.

Figure 2:
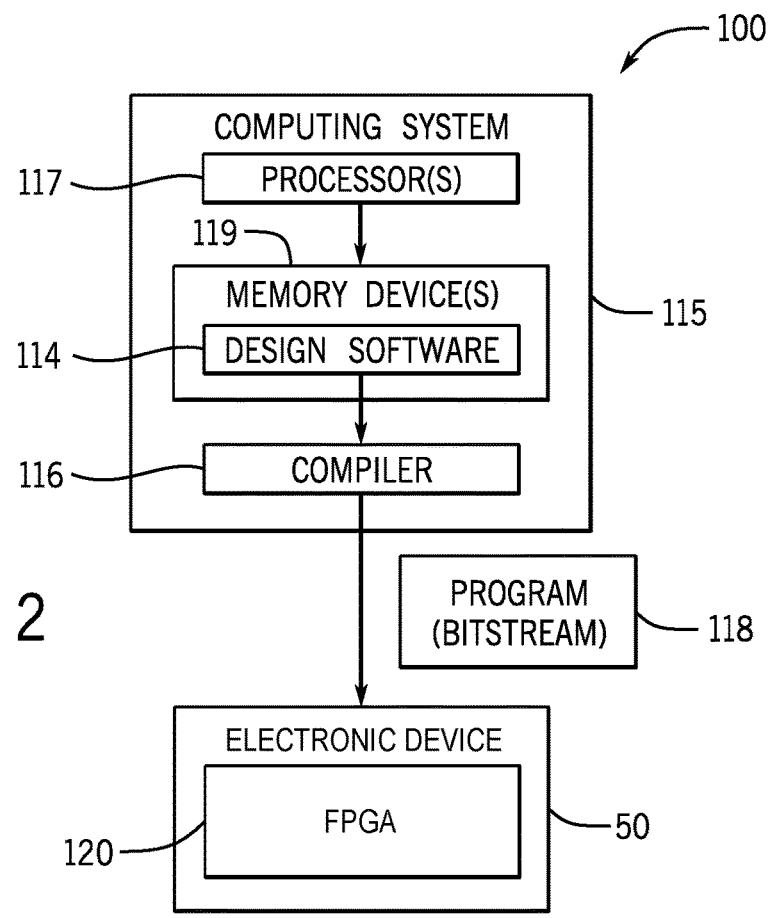
FIG. 2 is a system that may be used to obtain network interface cards that may including a configurable transceiver-based network circuitry employing programmable logic, in accordance with an embodiment.

As discussed above, certain components of the electronic device 50 may be implemented using FPGAs 120. A system 100 in FIG. 2 describes schematically a system for implementing hard IP and/or soft IP logic design 114 in one or more FPGAs of the electronic device 50. In the system 100, a computing system 115 may be used to create a logic design 114 for the processing circuitry 52 and/or the network circuitry 54. The computing system 115 may include a compiler 116, which may be implemented using one or more processors 117. The compiler 116 may produce a bit stream 118 from the logic design 114. It should be noted that the computing system 115 may include a memory device 119. The bit stream 118 may be used to program the FPGA 120. Memory device 119 may store the logic design 114, as well as software that facilitates logic design. Computing system 115 may also have in the memory device 119, verification software that, when executed by the one or more processors 117, implements the compiler 116 as well as providing testing, verification, and simulation functionalities, as understood in the art.

Figure 3:
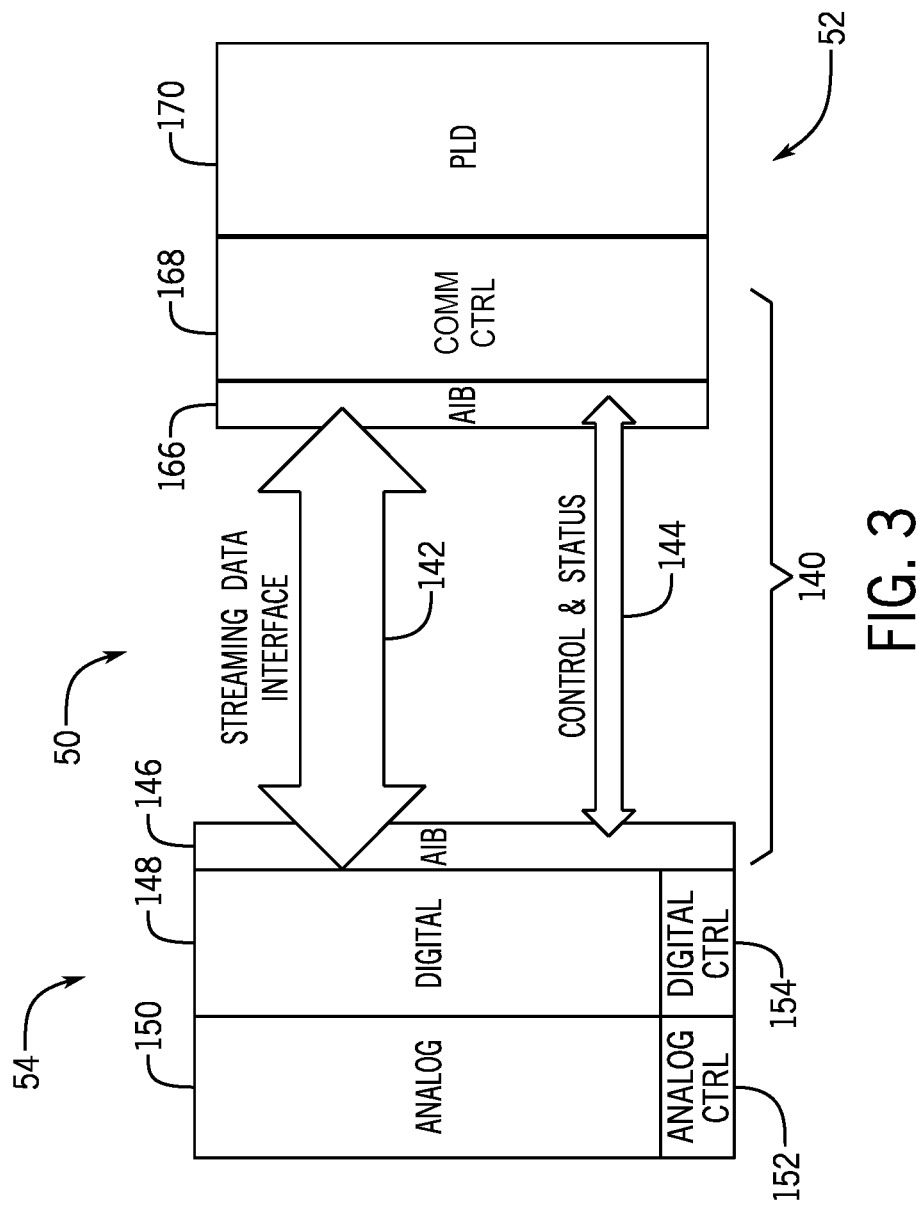
FIG. 3 is a diagram of the interconnect link in an electronic device that may use configurable transceiver-based network circuitry coupled to processing circuitries, in accordance with an embodiment.

The diagram in FIG. 3 provides a schematic diagram of a container architecture that may be used to establish connections between processing circuitry 52 and a network circuitry 54 in an electronic device 50. The containerized network circuitry 54 may be coupled to the processing circuitry 52 via an ASIC interconnect bus (AIB) 140. The AIB may be a 2-D, a 2.5-D, or a 3-D interconnect, as understood in the art. The AIB 140 may transport data using a data-streaming interface 142 and may provide control signals using a control and status interface 144.

The network circuitry 54 may have an AIB adaptor 146, which may provide connectivity with the AIB 140. The network circuitry 54 may also include a digital layer 148, which may be implemented with hardened logic, soft IP and/or hard IP. The network circuitry 54 may further include an analog layer 150, which may include clocking systems, CDRs, amplifiers, equalizers, and other analog circuitry used to couple the network circuitry 54 to a physical network. Network circuitry may also include analog control circuitry 152, and digital control circuitry 154, which may be used to provide transparent behavior of the network circuitry 54 to the processing circuitry 52, as detailed above.

The processing circuitry 52 may include an AIB adaptor 166, which may provide connectivity with the AIB 140. The processing circuitry may also include communication control circuitry 168, that may be used to implement abstract layers in the protocol stack (e.g., network layer, transport layer, application layer, etc.), and/or to generate control and status commands associated with the protocol. In some embodiments, the communication control circuitry 168 may be a high-speed serial interface layer. The communication control circuitry 168 may provide data communication services to the processing logic 170 of the processing circuitry 52. In systems in which the processing circuitry 52 is implemented using FPGAs or other programmable logic fabric, the processing logic 170 and/or the communication control circuitry 168 may be implemented using soft IP, hard IP, and/or hardened logic.

During the design process, the processing circuitry 52, including the processing logic 170, may be designed independently of the network circuitry 54, due to the containerized architecture of the network circuitry 54. The processing logic 170 may request data connectivity services of the network circuitry 54 through the communication control circuitry 168. In its turn, the communication control circuitry 168 may generate control and status signals to be transported in status bus 144 and data streams to be transported in data-streaming interface 142 via the AIB 140. The communication control signals may be based on a protocol. Examples of protocols include Ethernet protocol, PCIe, Interlaken protocol, serial advance technology attachment (SATA) protocol, optical transport network (OTN) protocol, UltraPath Interconnect (UPI) protocol, and a Common Public Radio Interface Protocol (CPRI), among other. Due to the containerized design, the design of both the communication control circuitry 168 and the processing logic 170 may substantially remain the same.

In order to allow compatibility, the containerized network circuitry 54 may include "gaskets," circuitry that may convert instructions received via the AIB 140 based on a specific implementation of the network circuitry. Certain gaskets may be associated with the digital layer 148, and may include MAC gaskets, and PMA gaskets, as discussed in more detail in FIG. 4. The analog control circuitry 152 and the digital control circuitry 154 may also provide gasket functionality by translating the instructions received from the control and status bus 144 to the specific implementation of the network circuitry 54.

As an example of a container design, the network circuitry 54 may provide Ethernet connectivity. Due to the container design, the processing circuitry 52 may communicate in an identical manner with a network circuitry 54 that provides Ethernet connectivity over a 4×100 GE (i.e., 4 channel 100 Gigabits/s Ethernet) over copper wires, or a 400 GE (i.e., 1 channel 200 Gigabits/s Ethernet) over optical fiber or backplane Ethernet. As such, if an upgrade of the electronic device 50 increases the bandwidth specification, the containerized network circuitry 54 may be replaced by a higher bandwidth containerized network circuitry 54, with little or no redesign of the processing circuitry 52. Moreover, it should be noted that the in some situations, an Ethernet network circuitry 54 may be replaced by a PCIe network circuitry 54 without redesign of the processing circuitry 52. As discussed above, in such situation the data stream gaskets and/or the control gaskets (e.g., analog control circuitry 152 and/or the digital control circuitry 154) may translate the Ethernet physical layer control commands to PCIe layer control commands. For standardization of the network circuitry 54 containers, a universal set of digital control commands and/or analog control commands may also be used. The universal control command set may be a superset of commands of existing protocols for the universal transceiver container.

Figure 4:
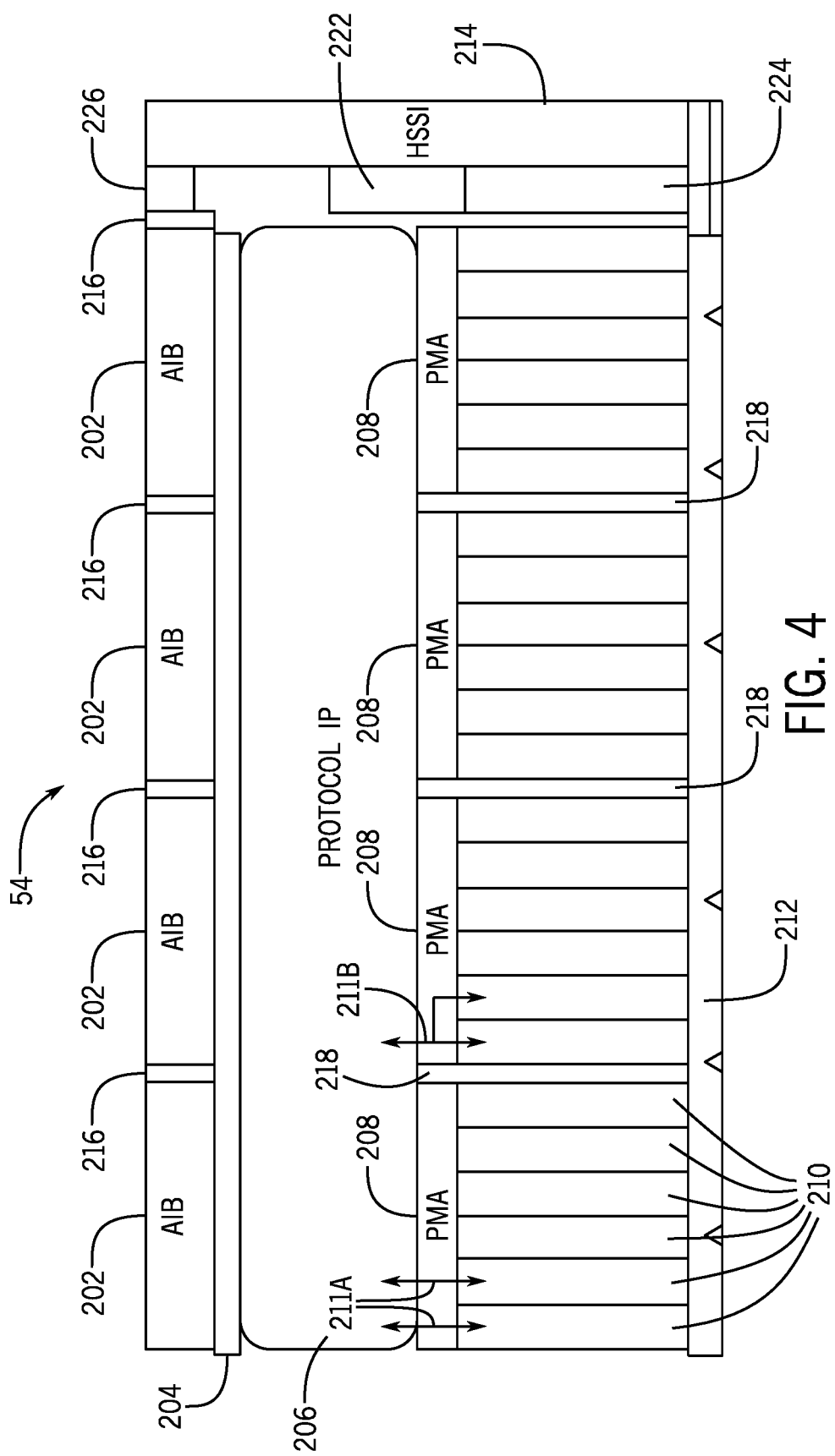
FIG. 4 is a diagram of a configurable transceiver-based network adaptor that may use configurable gaskets, in accordance with an embodiment.

A diagram of a floorplan for a containerized network circuitry 54 is illustrated in FIG. 4. As discussed above, the network circuitry 54 may be implemented using programmable logic and/or hardened circuitry. The illustrated floorplan may have 4 different channels and/or lanes but other number of channels and/or lanes may be used for this design. The network circuitry 54 may include AIB adaptors 202 (e.g., interconnect bus interfaces), which may be used to couple each lane to an AIB interface, as illustrated in FIG. 3. The AIB adaptors 202 may be coupled to a digital gasket adaptor, which may provide an interface between the data received from the AIB and data provided to a protocol IP block 206.

As discussed above, the protocol IP block 206 may implement a digital logic layer, such as MAC layer for an Ethernet adaptor, or a logic layer for a PCIe adaptor. The digital gasket 204, thus, may receive the data from AIB adaptors 202 and rearrange or translate the received data for the protocol IP block 206. For example, if the processing circuitry is configured to send and/or receive data over 4 channels but the protocol IP block 206 implements a 2-channel protocol, the digital gasket 204 may be configured to provide seamless conversion between the 4-channel AIB data and the 2-channel protocol IP block data. As another example, if the processing circuitry is configured to employ Ethernet protocol but the protocol IP block 206 is configured to operate using a PCIe interface, the digital gasket 204 may operate as an adaptor between the two different data links.

The protocol IP block 206 may be coupled to the PMA gaskets 208, which may be used to couple to PCS lanes 210. In the illustrated circuit, each lane of network circuitry 54 may include one PMA gasket 208 and 6 PCS lanes 210. Each PCS lane 210 may be associated with a transceiver which may be configured to send and/or receive serial data to a physical medium. The PMA gasket 208 may be used for mapping between the PCS lanes 210 and the logical lanes of the protocol IP block 206. As an example of the flexibility in configuration, the protocol IP block 206 may be configured to provide data in a 4-level pulse-amplitude modulation (PAM4) encoding or in non-return-to-zero (NRZ) encoding. As understood in the art, the PAM4 encoding may include 2 bits per clock cycle of serial data, whereas the NRZ encoding may include a single bit per clock of serial data.

As such, if the protocol IP block 206 is configured to employ the NRZ encoding, the PMA gasket 208 may map a signal PCS lane 210 per logic channel (arrows 211A), whereas if the protocol IP block 206 is configured to employ the PAM4 encoding, the PMA gasket 208 may map two PCS lanes 210 per logic channel (arrow 211B). It should be understood that the above illustrations is provided as a description of how the PMA gasket 208 may be used to provide flexible mapping between the transceivers in the PCS lanes 210 and the protocol IP block 206, and is not limited to the encoding described above. Moreover, while 1-to-1, a 1-to-2, and a 2-to-1 mappings were described, the PMA gasket 208 may support mappings in a generic M-to-N format (e.g., 2-to-1, 1-to-4, 1-to-6, 2-to-3, etc.) based on the implementation specifications for the particular network circuitry 54.

As discussed above, multiple PCS lanes 210 may be operated synchronously, as they may be mapped to a single logical lane or serial stream. To that end, the network circuitry 54 may include a distributed configurable clock network 212 to facilitate the M-to-N mapping described above. The configurable clock network 212 may be also used to adjust the bandwidth of the transmitted and the received signal, which may be different from the data rate at the PMA gasket 208. For example, the configurable clock network 212 may be configured to make the data rate of the PCS transceiver to be, for example, 50% higher than the rate of the data provided to the PMA gasket 208. Thus, the configurable clock network 212 may allow fractional mappings in the PMA gasket 208, i.e., M-to-N mappings in which M and/or N may be non-integers.

While the example illustrated in FIG. 4 illustrates a single protocol IP block 206 bound to the PCS lanes 210 through the PMA gasket 208, network circuitry 54 may have more than one protocol IP block. For example, a first protocol IP block may be bound to two lanes (e.g., the two right-most lanes including 2 PMA gaskets 208 and 12 PCS lanes 210) and a second protocol IP block may be bound to the other two lanes (e.g., the two left-most lanes including 2 PMA gaskets 208 and 12 PCS lanes 210). The first protocol IP block and the second protocol IP block may be of the same type. For example, the two protocol IP blocks may be two PCIe blocks. Moreover, the first protocol IP block and the second protocol IP block may be of distinct types. For example, the first protocol IP block may be a PCIe block and the second protocol IP block may be an Ethernet block. Note further that multiple PCS blocks may be bound to common PMA lanes. As an example, the same PMA could sometimes operate as PCIe protocol IP block and sometimes as Ethernet protocol IP block.

Network circuitry 54 may also include a high-speed serial interface (HSSI) controller 214, which may be used to control the flow of data in the network circuitry. The HSSI controller 214 may receive data link instructions (e.g., signals from status bus 144). The HSSI controller 214 may interface with the other components of the network circuitry through the digital control gasket 222 and the analog control gasket 224. As with the digital gasket 204 and the PMA gaskets 208, the digital control gasket 222 and analog control gasket 224 may provide translation or adaptor services between the signals received by the HSSI controller 214, as related to a specific protocol implementation, to the controls used by the physical implementation of the network circuitry 54. The network circuitry may also include an AIB gasket 226, which may be employed to improve additional flexibility to the network circuitry 54. The floorplan of network circuitry 54 may also include AIB isolation modules 216 and PMA/PCS isolation modules 218, which may be used to decrease electrical interference between the high-speed data busses or serial connections.

In some implementations, the gaskets (e.g., gaskets 204, 208, 222, 224, and 226) may be implemented using programmable logic, and the other components of the network circuitry 54, such as the AIB adaptors 202, the protocol IP block 206, and the HSSI controller 214, may be implemented using hardened digital circuitry. As such, the network circuitry 54 may be upgraded by re-configuration of the gaskets, and without substantial re-design of other logical components. As the gaskets provide translation services, verification, simulation, and/or testing of the gasket redesigns may be simpler than in a redesign of the entire network circuitry 54. Moreover, the modular interfaces provided by the gaskets may facilitate standardization of components by providing an interface specification.

Figure 5:
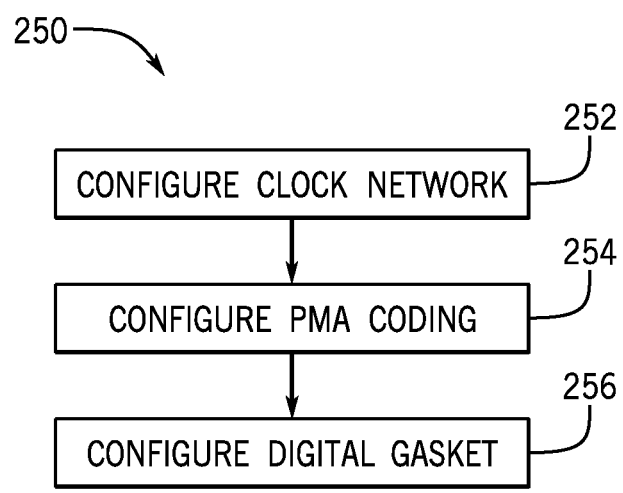
FIG. 5 is a flow chart of a method to configure the gaskets of a configurable transceiver-based network circuitry, such as the one of FIG. 4, in accordance with an embodiment.

The flow chart in FIG. 5 illustrates a method 250 for configuration of a containerized network circuitry 54, such as the one illustrated in FIG. 4. As discussed above, the containerized network circuitry 54 may include configurable elements, which may be implemented in programmable fabric, and fixed elements, which may be implemented in hardened fabric. For example, a network circuitry may have the hardened protocol IP block that implements an Ethernet standard (e.g., a 4×100 GE standard) or a PCIe×16 standard. Such a network circuitry 54 may be configured by processes including configuration of the clock network (process 252), configuration of PMA gaskets (process 254), and configuration of the digital gasket (process 256). It should be noted that this processes may be performed in any order, during the design process of the network circuitry. In the process 252, the clock network may be configured to provide specific clock frequencies to specific transceivers based on the data rate of the protocol and the PMA gasket mapping described above. In the process 254, the PMA gaskets may be configured to provide the PMA gasket mapping and the PMA coding (e.g., NRZ or PAM4). In the process 256, the digital gasket 256 may be configured to provide a transparent interface to the processing circuitries of the electrical device.

The transparent protocol-independent interface provided by the containerized network circuitries 54 discussed above may facilitate a modular assembly for electronic devices. For example, by employing a standardize floorplan and standardized connectors, network circuitries may be implemented as chiplets, integrated circuits with standardized interfaces. FIGS. 6A, 6B, 6C, and 6D illustrate electronic devices 300, 310, 320, and 330, respectively, which may employ containerized network circuitries coupled to processing logic circuit. The electronic device 300 illustrated in FIG. 6A may include a programmable logic 302 which may be coupled to 3 network chiplets 304, 306, and 308. The programmable logic 302 may be coupled to the chiplets via an AIB interconnect.

As discussed above, the programmable logic 302 in electronic device 300 may be seamlessly integrated with Ethernet chiplet 304, which implements a 56 G 100 GE Ethernet interface, as well as with PCIe chiplets 306 and 308, which implement a 28 G PCIe interface. Similarly, the electronic device 310 may be seamlessly integrated with the PCIe chiplets 312 and 314 as well as with the Ethernet chiplet 316. Note that the floorplan used by electronic device 310 may be larger, and may have empty slots 318. As illustrated, the smaller layout of electronic device 300 may allow up to 3 chiplets. By contrast, the layout of electronic device 310 may allow up to 6 chiplets. In fact, the illustrated electronic device 320 may include 6 chiplets: 4 Ethernet chiplets 322 and two PCIe chiplets 324. To further illustrate the flexibility of the container-based chiplet design, the electronic device 330 may include 2 Ethernet chiplets 332 and 2 PCIe chiplets 334 coupled to the programmable logic 302, as well as the 2 empty slots 336. Notice that the flexible location of the chiplets may facilitate the floorplan design in the programmable logic 302, by reducing certain constraints related to data paths, as understood in the art.

The chiplets 350, 352, 354, and 356 in FIGS. 7A, 7B, 7C, and 7D, respectively, illustrate the diversity of network adaptors that can be produced using the containerized design illustrated in FIG. 4. Chiplet 350 may be a 17 gigabits per second (17 G) interface that may bond to a 3rd generation PCIe (PCIe Gen3) physical channel. Chiplet 352 may be a faster 28 gigabits per second (28 G) interface that may bond to a similar PCIe Gen3 physical channel. Chiplet 354 may be a 56 gigabits per second (56 G) Ethernet interface that may be coupled to a copper-wire or backplane based 4×100 GE physical channel. Chiplet 356 may be a 112 gigabits per second (112 G) Ethernet interface that may be coupled using a photonics based physical channel. While the specific implementations of each chiplet may be different, the above-described AIB-based standardized interfaces may allow for seamless swappable interface design.

A layout 370 for a container-based electronic device is illustrated in FIG. 8. In the layout 370, a programmable logic 302 may be coupled to a variety of chiplets 372 and 374. Note that in this layout, chiplets 372 may have a floorplan that may be different from chiplets 374. Moreover, the connection between the programmable logic 302 and chiplets 372 may be provided by an interconnect standard 376A, which may be different from the interconnect standard 376B used to couple the programmable logic 302 to chiplets 374. In some systems, the chiplets 374 may include transceivers 378 and may be network adaptors. Chiplets 374 may include accelerators (e.g., graphical processing units, neural network circuitries, CPUs, etc.) or memory devices (e.g., Flash memory, read-only memory devices, random access memory devices, etc.). Note that, due to the standardization provide by interconnect standards 376A and 376B, redesign of new chiplets and/or of new programmable logic 302 may be provided without substantial redesign of the other parts, which may increase the speed of the design process.

Figure 9:
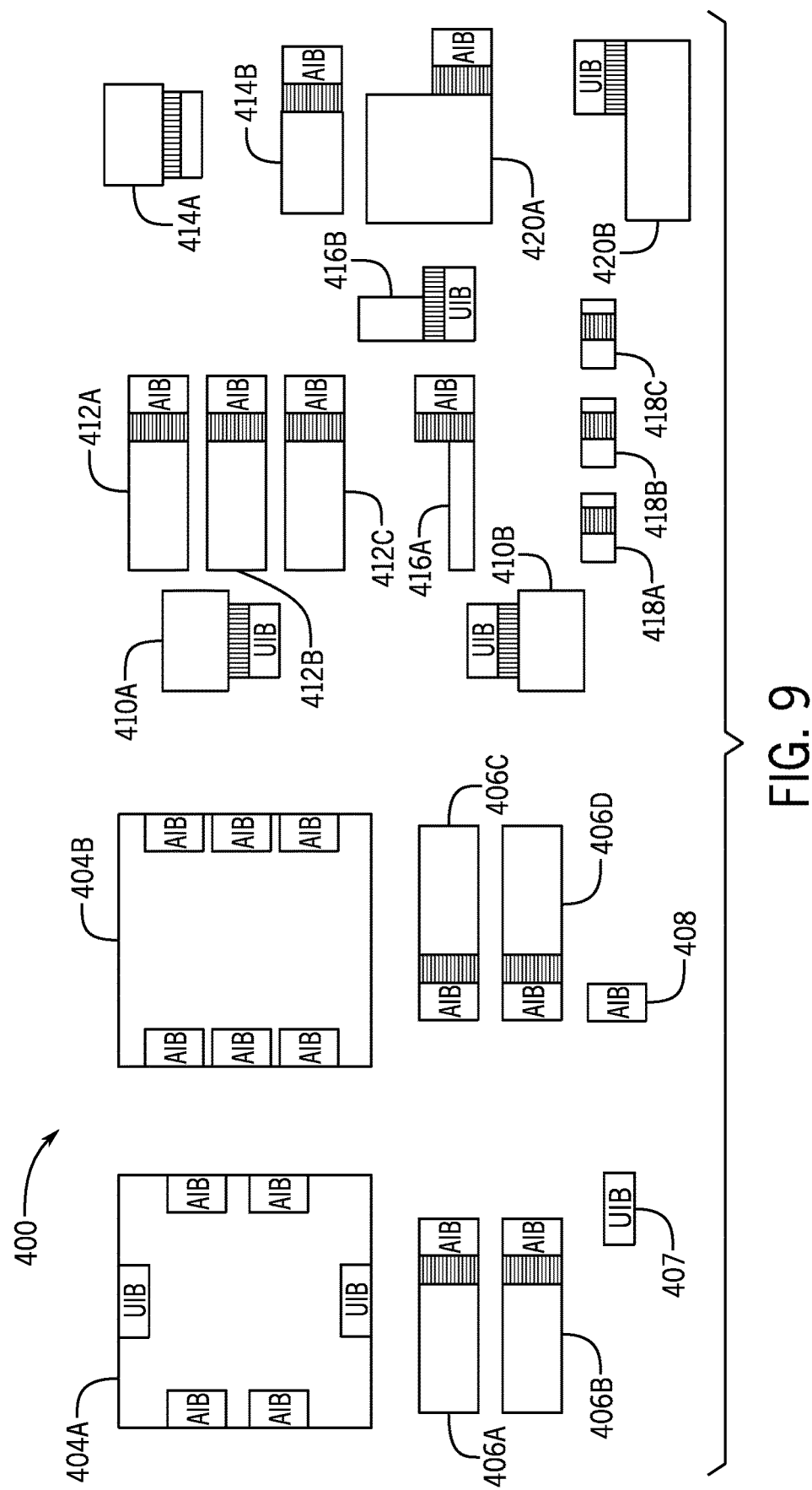
FIG. 9 is a diagram of multiple chiplets that may be used with the modular architecture of FIG. 8, in accordance with an embodiment.

Moreover, it should be noted that the chiplet-based design may not be limited to communication and/or transceiver based circuitry. The diagram in FIG. 9 illustrates chiplets 400 that may be used to assemble electronic devices. Chiplets 404A and 404B may be programmable logic devices or processors, which may include AIB interconnects for coupling with off-board accelerators or adaptors, as discussed above. Chiplet 404A may also include universal interconnect buses (UIB), which may be used to couple to other devices. Chiplets 406A, 406B, 406C, and/or 406D may be transceiver chiplets that may implement containerized data communication interfaces, as discussed above. The set of chiplets 400 may also include stand-alone UIB adaptors 407 and AIB adaptors 408, which may be used to produce chiplets for other circuitry. For example, chiplets 410A and 410B may be memory chiplets, such as high-bandwidth memory (HBM) chiplets. Chiplets 412A, 412B, and 412C may be multi-channel analog-to-digital converters (ADC) chiplets, multi-channel digital-to-analog-converters (DAC) chiplets, and/or multi-channel ADC/DAC chiplets that facilitate interfacing the programmable logic with sensors and actuators.

Chiplets 414A and 414B may be an accelerator circuitry. As illustrated, chiplet 414A may be implemented using the UIB interface and chiplet 414B may be implemented using the AIB interface. Chiplets 416A and 416B may be chiplets with reduced floorplan that may couple to the programmable logic using the standardized interfaces. Circuitries may also provide more general non-transceiver communication such as via an analog signal chiplet 418A, a radio-frequency chiplet 418B, and/or other mix-signal IP chiplets 418C. It should be noted the dimensions of the chiplets may also be larger, as illustrated with an alternatively shaped AIB chiplet 420A and an alternatively shaped UIB chiplet 420B.

Figure 10:
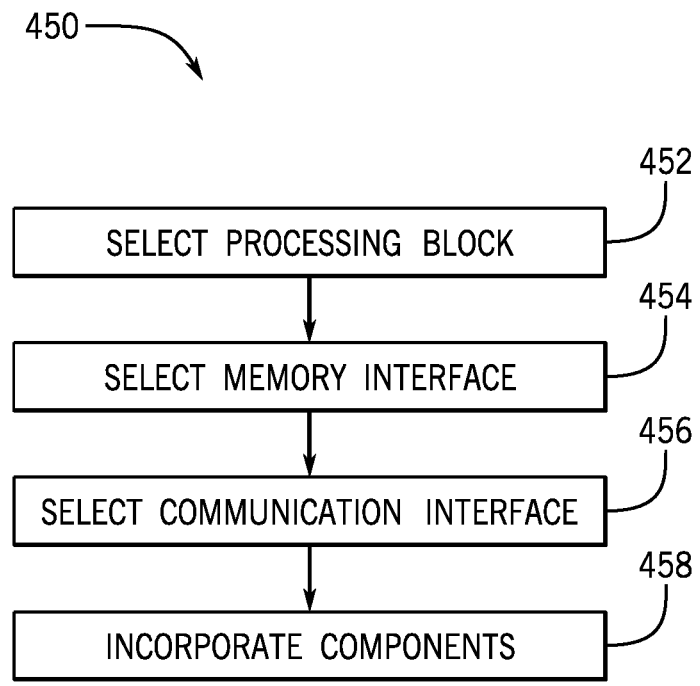
FIG. 10 is a flow chart of a method that may be used to design circuitries using the modular architecture of FIG. 8, in accordance with an embodiment.

The flow chart illustrated in FIG. 10 illustrates a method 450 to design an electronic device using the chiplet-based architectures, which may include a containerized network interface, as described above. Method 450 may include a processing block selection process (process 452). In such process, the designer may choose the technology (e.g., ASIC, CPU, FPGA, etc.) and the power of the processing block. As discussed above, the processing block may be compatible with AIB and/or UIB interfaces described above. In a memory interface selection process (process 454), the designer may chose a memory that may be appropriate for the operation of the electronic device. The designer may choose communication interfaces used by the application (process 456). The communication interfaces may include circuitry which may include serial data transceivers, as discussed above. Selection of the communication interfaces may include application of the method 250 of FIG. 5 for configuration of the communication chiplets. In a process 458, the components may be incorporated into the design. For the modules of the electronic device that may be configured and/or programmed using the programmable logic device, the incorporation of the design may take place by the system 100 of FIG. 2 to implement logic design defined in a soft IP block or a hard IP block.

Figure 11:
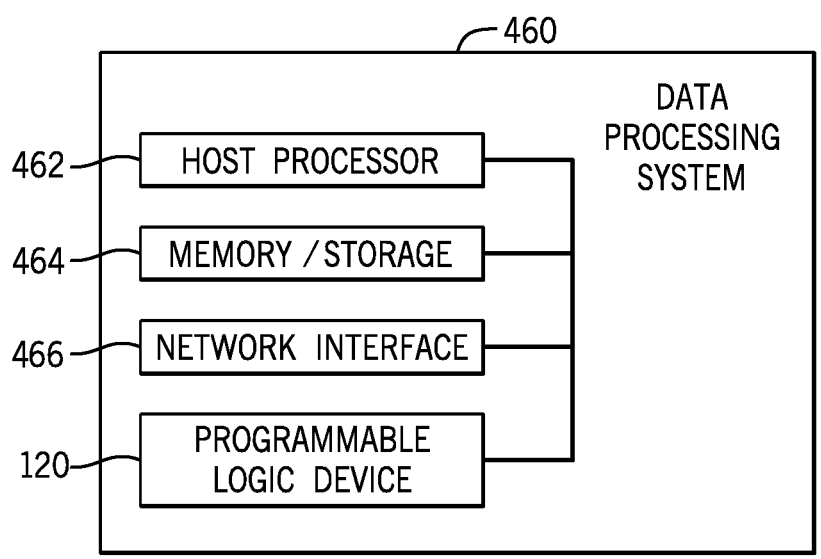
FIG. 11 is a diagram of a data processing system that may use the programmable logic device to rapidly respond to data processing requests, in accordance with an embodiment.

The FPGA 120 described above may be, or may be a component of, a data processing system. For example, the FPGA 120 may be a component of a data processing system 460, shown in FIG. 11. The data processing system 460 includes a host processor 462, memory and/or storage circuitry 464, and a network interface 466. As described above, the network interface may be a second FPGA with the containerized transceivers described above. The data processing system 460 may include more or fewer components (e.g., electronic display, user interface structures, application specific integrated circuits (ASICs)). The host processor 462 may include any suitable processor, such as an Intel® Xeon® processor or a reduced-instruction processor (e.g., a reduced instruction set computer (RISC), an Advanced RISC Machine (ARM) processor) that may manage a data processing request for the data processing system 460 (e.g., to perform machine learning, video processing, voice recognition, image recognition, data compression, database search ranking, bioinformatics, network security pattern identification, spatial navigation, or the like). The memory and/or storage circuitry 464 may include random access memory (RAM), read-only memory (ROM), one or more hard drives, flash memory, or the like. The memory and/or storage circuitry 464 may be considered external memory to the FPGA 120, and may hold data to be processed by the data processing system 460. In some cases, the memory and/or storage circuitry 464 may also store configuration programs (bitstreams) for programming the FPGA 120. The network interface 466 may allow the data processing system 460 to communicate with other electronic devices. The data processing system 460 may include several different packages or may be contained within a single package on a single package substrate.

In one example, the data processing system 460 may be part of a data center that processes a variety of different requests. For instance, the data processing system 460 may receive a data processing request via the network interface 466 to perform machine learning, video processing, voice recognition, image recognition, data compression, database search ranking, bioinformatics, network security pattern identification, spatial navigation, or some other specialized task. The host processor 462 may cause the programmable logic fabric of the FPGA 120 to be programmed with a particular accelerator related to requested task. For instance, the host processor 462 may instruct that configuration data (bitstream) stored on the memory/storage 464 or cached in sector-aligned memory of the FPGA 120 to be programmed into the programmable logic fabric of the FPGA 120. The configuration data (bitstream) may represent a circuit design for a particular accelerator function relevant to the requested task. Due to the high density of the programmable logic fabric, the proximity of the substantial amount of sector-aligned memory to the programmable logic fabric, or other features of the FPGA 120 that are described here, the FPGA 120 may rapidly assist the data processing system 460 in performing the requested task.

The containerized transceiver-based network circuitries described herein may allow modular design and assembly of electronic devices. By employing internal configurable gaskets as well as a protocol-based standardized interface over interconnect buses such as the AIB bus, network circuitries may be changed without substantial re-design of the processing logic of the electronic devices. As such, the time-to-market of devices as the processing and/or communication technologies advance, since reduced redesign simplify design and verification steps. Moreover, the flexibility provided by the standardize interface may also increase the speed of development of new electronic devices, by providing a fixed, transparent system for design of the communication functionalities.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. A network adaptor, comprising:
a plurality of physical coding sublayer (PCS) lanes;
a protocol intellectual property (IP) block configured to implement a first protocol;
a physical medium attachment (PMA) gasket circuitry configured to couple the PCS lanes to the protocol IP block;
an interconnect bus interface configured to provide connectivity between the network adaptor to an interconnect bus; and
a digital gasket circuitry configured to couple the protocol IP block to the interconnect bus interface.

2. The network adaptor of claim 1, wherein the first protocol comprises a peripheral component interconnect express (PCIe) protocol, an Ethernet protocol, an Interlaken protocol, a serial advance technology attachment (SATA) protocol, an optical transport network (OTN) protocol, an UltraPath Interconnect (UPI) protocol, or a Common Public Radio Interface Protocol (CPRI), or any combination thereof.

3. The network adaptor of claim 1, wherein the protocol IP block implements a non-return-to-zero (NRZ) encoding, and wherein the digital gasket circuitry is configured to provide a 1-to-1 mapping for transmission and/or reception of serial data.

4. The network adaptor of claim 1, wherein the protocol IP block implements a 4-level pulse-amplitude modulation (PAM4) encoding, and wherein the digital gasket circuitry is configured to provide a 2-to-1 mapping for transmission of serial data from the protocol IP block to the PCS lanes and a 1-to-2 mapping for reception of serial data from the PCS lanes to the protocol IP block.

5. The network adaptor of claim 1, wherein interconnect bus interface comprises an application-specific integrated circuit (ASIC) interconnect bus (AIB).

6. The network adaptor of claim 1, wherein the protocol IP block comprises hardened digital circuitry, and wherein the PMA gasket circuitry and the digital gasket circuitry comprises programmable fabric.

7. The network adaptor of claim 1, comprising:
a high-speed serial interface (HSSI) circuitry configured to exchange control and status signals from the interconnect bus interface;
a digital control gasket circuitry configured to couple the HSSI circuitry to the protocol IP block; and
an analog control gasket circuitry configured to couple the HSSI circuitry to the PCS lanes.

8. The network adaptor of claim 7, wherein the HSSI circuitry comprises hardened circuitry, and wherein the digital gasket circuitry and the analog gasket circuitry comprises programmable fabric.

9. The network adaptor of claim 1, comprising a configurable clock network configured to provide a plurality of clock signals to the PCS lanes.

10. The network adaptor of claim 1, wherein the network adaptor comprises a chiplet network adaptor.

11. The network adaptor of claim 1, comprising:
a second plurality of PCS lanes;
a second protocol IP block configured to implement a second protocol; and
a second PMA gasket circuitry configured to couple the second plurality of PCS lanes to the second protocol IP block.

12. The network adaptor of claim 11, wherein the second protocol is the same as the first protocol or the second protocol is different from the first protocol.

13. An electronic device comprising:
processing circuitry comprising an interconnect bus interface; and
network circuitry coupled to the processing circuitry via the interconnect bus interface, wherein the network circuitry comprises:
a first plurality of physical coding sublayer (PCS) lanes;
a first protocol intellectual property (IP) block configured to implement a protocol;
a first physical medium attachment (PMA) gasket circuitry configured to couple the first plurality of PCS lanes to the first protocol IP block;
an interconnect bus interface configured to provide connectivity between the network circuitry to an interconnect bus;
a digital gasket circuitry configured to couple the first protocol IP block to the interconnect bus interface;
a high-speed serial interface (HSSI) circuitry configured to exchange control and status signals from the interconnect bus interface;
a digital control gasket circuitry configured to couple the HSSI circuitry to the first protocol IP block; and
an analog control gasket circuitry configured to couple the HSSI circuitry to the PCS lanes.

14. The electronic device of claim 13, wherein the processing circuitry comprises a high-speed serial controller configured to send and receive the control and status signals to the HSSI circuitry of the network circuitry.

15. The electronic device of claim 13, wherein the interconnect bus interface is configured to couple to an application-specific integrated circuit (ASIC) interconnect bus (AIB).

16. The electronic device of claim 13, wherein the processing circuitry comprises a second interconnect bus interface that comprises a universal interconnect bus (UIB) interface.

17. The electronic device of claim 16, comprising a high-bandwidth memory (HMB) device coupled to the processing circuitry using the UIB interface.

18. The electronic device of claim 13, wherein the network circuitry comprises a first network chiplet.

19. The electronic device of claim 18, wherein the processing circuitry is configured to couple to a second network chiplet.

20. The electronic device of claim 19, wherein the first network chiplet comprises an Ethernet chiplet and the second network chiplet comprises a peripheral component interconnect express (PCIe) chiplet.

21. The electronic device of claim 13, comprising a second protocol IP block configured to implement a second protocol, wherein the second protocol IP block is configured to couple to a second plurality of PCS lanes via a second PMA gasket.

22. A method to configure a network interface comprising a plurality of transceivers, a protocol intellectual property (IP) block, a physical medium attachment (PMA) gasket, and a digital gasket, the method comprising:
   receiving a protocol specification for an interconnect bus;
   configuring the digital gasket that couples the protocol IP block to the interconnect bus based on the received protocol specification and a protocol of the protocol IP block;
   determining a PMA coding based on the received protocol specification; and
   configuring the PMA gasket based on the PMA coding, wherein configuring the PMA gasket comprises mapping at least one physical coding sublayer (PCS) lane of a plurality of PCS lanes to a logical lane of the protocol IP block.

23. The method of claim 22, comprising:
   determining a data rate associated with the received protocol specification; and
   configuring a clock network of the network interface to provide clocking signals to the plurality of PCS lanes.

24. The method of claim 22, comprising:
   configuring a digital control gasket that couples a high-speed serial interface (HSSI) circuitry of the network interface to the protocol IP block based on the received protocol specification and the protocol of the protocol IP block; and
   configuring an analog control gasket that couples the HSSI circuitry to the plurality of PCS lanes.

* * * * *